Jan. 26, 1971 J. B. JONES 3,557,430

DE-SOLDERING APPARATUS

Filed Aug. 21, 1968 2 Sheets-Sheet 1

INVENTOR
JAMES B. JONES

BY Edward J Norton
ATTORNEY

Jan. 26, 1971 J. B. JONES 3,557,430

DE-SOLDERING APPARATUS

Filed Aug. 21, 1968 2 Sheets-Sheet 2

INVENTOR
JAMES B. JONES

BY Edward J. Norton
ATTORNEY

United States Patent Office 3,557,430
Patented Jan. 26, 1971

3,557,430
DE-SOLDERING APPARATUS

James B. Jones, Santa Monica, Calif., assignor to RCA Corporation, a corporation of Delaware Filed Aug. 21, 1968, Ser. No. 754,300
Int. Cl. H05k *13/04;* B23p *19/00*
U.S. Cl. 29—203 4 Claims

ABSTRACT OF THE DISCLOSURE

The disclosed invention relates to apparatus for removing a component, such as an integrated circuit, from a substrate, such as a printed circuit board, to which it has been solder secured. Apparatus in accordance with the present invention comprises a heat source, means for disposing the solder connections proximate to said heat source, and means for effectuating the removal of the component from the substrate when the solder connections are caused to reflow.

BACKGROUND OF THE INVENTION

It has become commonplace in the electronics industry to utilize substrates, such as printed circuit boards, as a means for providing interconnecting circuitry between circuit components such as resistors, capacitors, diodes, transistors, etc., mounted thereon. With the advent of integrated circuits (IC's), it was recognized that a marriage betwee the printed substrate and the integrated circuit was inevitable. The inegrated circuit, however, has proven to be an expensive as well as a temperamental bride. A significant problem occurs should it become necessary to separate the IC from the substrate. To appreciate the nature of this problem it is necessary to understand the manner in which the IC is secured to the substrate.

An integrated circuit generally comprises a body portion, in which the solid state elements are housed, and a plurality of interconnecting leads which project therefrom. These leads are then fitted into holes formed within the printed substrate. The under surface of the substrate, together with the projecting leads, are then passed over a solder wave to effectuate a solder connection between each of the leads and the substrate.

While the technique of attaching the integrated circuit to the substrate is basically similar to prior art techniques for the attachment of resistors, diodes, transistors, etc., the problem of removal is compounded due to the greater number of leads associated with the IC. Where in the past it was necessary to remove a resistor, a diode, or a transistor, this was usually accomplished by simultaneously heating the solder connected leads causing the solder to reflow and thereafter removing the component with a prying tool. As an alternative the component could be merely cut from the board with a pair of clippers and replaced with a new element.

The increased expense associated with integrated circuits rules out the latter technique. With regard to the former technique it is difficult to get all of the soldered connections to reflow simultaneously thereby often resulting in a cracking of one or more of the leads when it is attempted to pry the component from the board.

To overcome the forementioned shortcomings, techniques have been developed whereby the substrate is passed over a solder wave to effectuate a simultaneous reflowing of all the solder connections securing the IC to the substrate thereby permitting the component to be removed with a plier-like tool. Although an improvement over prior art techniques, problems still arise if the component is not removed at a precise moment. For example, if an attempt is made to remove the component before the solder has had a sufficient opportunity to reflow, one or more of the leads can be broken; on the other hand, if the substrate is permitted to remain in the molten solder for too long a period of time the excessive heat can cause damage to the board, the components on the board, and perhaps have a detrimental effect upon other solder joints.

SUMMARY OF THE INVENTION

This invention relates generally to printed circuit repair techniques and, more particularly, to apparatus for removing components, such as integrated circuits, from supporting substrates, such as printed circuit boards, to which they have been soldered.

In accordance with the present invention apparatus for removing a component from a substrate to which it has been soldered comprises a concentrated source of heat constricted to an area which corresponds to the area encompassed by the solder connections securing said component to said substrate; means for locating the substrate such that the component to be removed is positioned proximate to said source of heat; and, a tension device adapted for attachment to the component and poised to cause said component to be removed from the substrate when the solder connections are exposed to said source of heat.

The novel features which are considered characteristic of the present invention are set forth in the appended claims. The invention itself, both as to its organization and method of operation, as well as the objects and advantages thereof, will be best understood by reading the following description in conjunction with the accompanying drawings, wherein:

Figures 1, 3:
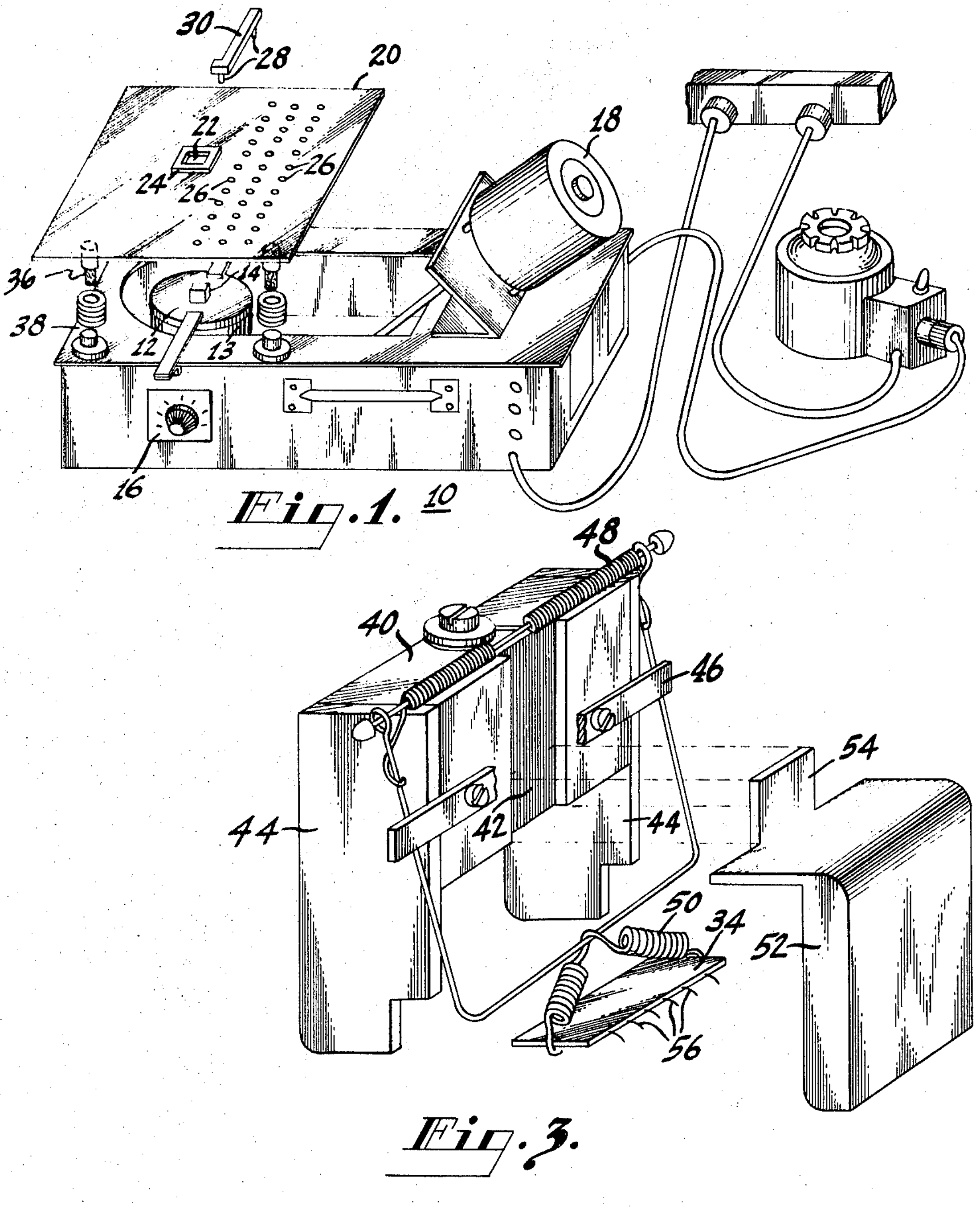
FIGURE 1 is illustrative of apparatus, absent the tension device, in accordance with one embodiment of the present invention.
FIGURE 3 is an exploded view of a tension device which may be used in accordance with the present invention.
Figure 2:
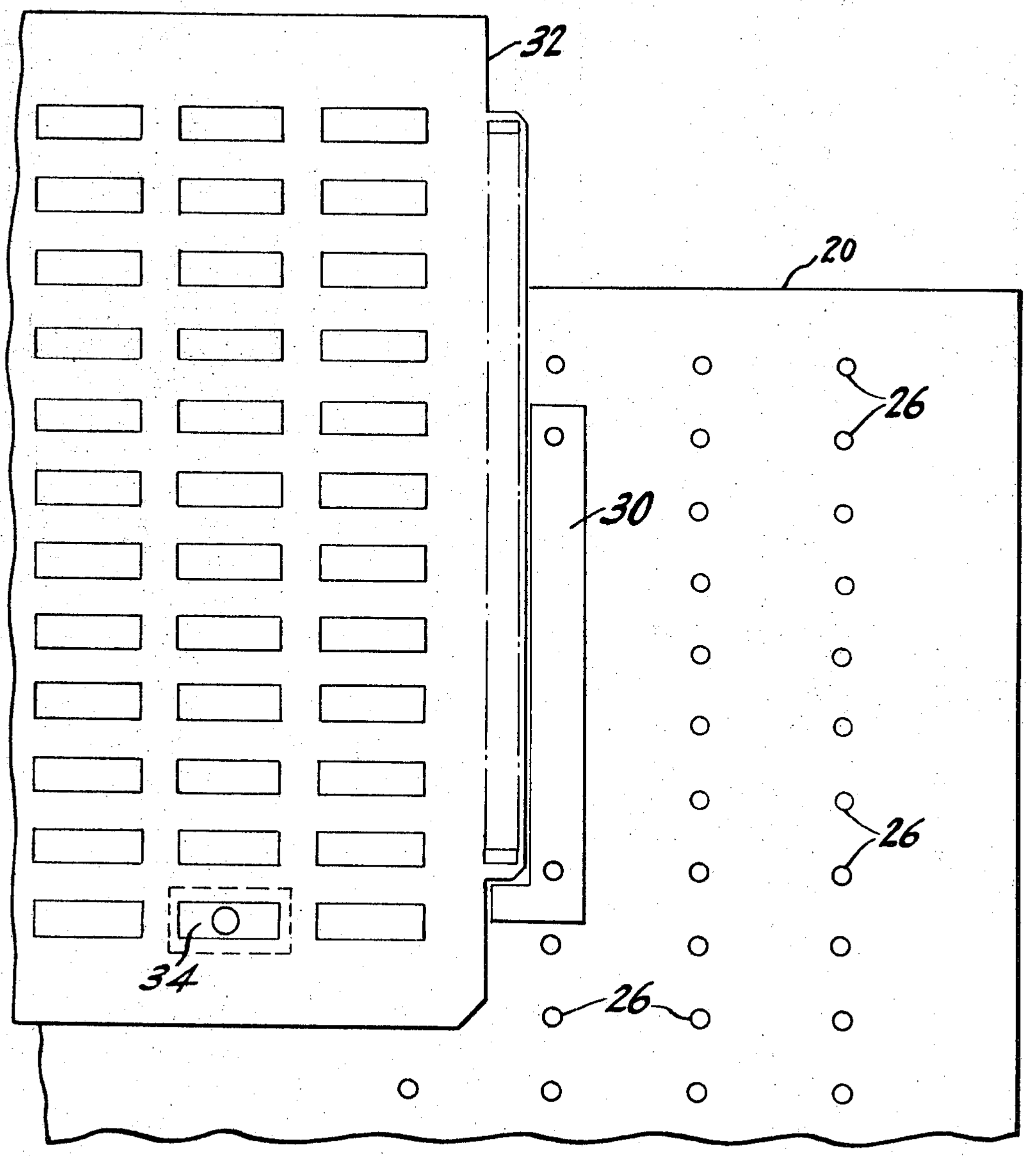
FIGURE 2 is an enlarged view of the masking plate shown in FIGURE 1 used for properly positioning the component carrying substrate which is also depicted.

Turning now to a description of the figures a conventional fountain type solder pot 10 is modified by the placement of a cap 12 over the fountain head 13. The cap 12 is provided with an orifice 14 having a shape conforming to the area of the component to be removed. The orifice 14 within the cap 12 operates to constrict the solder output of the fountain 13 and localize it to within a desired area. The solder pot 10 may be of the type having an adjustable heater thermostat 16 for controlling the temperature of the molten solder and a motor driven pump 18 for controlling the operation of the fountain.

A masking plate 20 is positioned above the capped solder fountain as shown in FIGURE 1. The masking plate 20 is formed with an opening 22 that conforms to the orifice 14 of the cap 12. A gasket 24 having a similarly shaped orifice and capable of withstanding high temperatures is mounted on the masking plate 20 above the opening. The masking plate 20 further contains a plurality of holes 26 adapted to receive the locating pins 28 of a moveable module stop 30. The module stop 30 is positioned in the appropriate holes 26 so that when the component carrying substrate 32 is wedged thereagainst the component 34 to be removed is centered within the hole 22 of the gasket 24 and masking plate 20, above the orifice 14 within the fountain cap 12.

The masking plate 20 may further be provided with centering pads 36 adapted to fit within spring loaded footing 38 so that upon the application of pressure to the plate 20 the springs will be contracted thereby permitting the plate 20 to come in closer proximity with the solder pot 10.

FIG. 3 is a partially exploded view of a tension device which is used with the apparatus of Fig. 1 as described infra. It will be seen that the tension device comprises a main body portion 40 which may be made from a block of phenolic. The main body portion 40 is formed with a slot 42 and has attached to it two side panels 44. A narrow strip of steel 46 is secured to the body portion 40 and positioned so as to span the slot 42 and extend slightly beyond the side panels 44. The steel strip 46 serves as a stop for a spring assembly 48 which is mounted to the body portion 40 as shown in Fig 3. The spring assembly 48 is of the conventional type and is similar to that of a standard mousetrap. A second spring 50 is interlocked with the spring assembly 48 and is of a size and shape such that is can readily be secured about the component 34 to be removed. Finally, a cover member 52 is provided having a projecting lip 54 adapted to fit under the spring stop 46 and into the groove 42 within the main body member 40.

In operation the centering pads 36 of the masking plate 20 are positioned within the spring loaded footings 38. The module stop 30 is thereafter appropriately positioned so that when the substrate 32 is fitted against it, the component 34 to be removed is centered above the orifice 14 within the fountain cap 12. The undersurface portion of the substrate 32 proximate the component 34 to be removed is painted with a fluxing compound and the substrate 32 is thereafter positioned against the module stop 30. Next the tension device 40 is placed upon the substrate 32 above the component 34 to be removed and the spring assembly 48 is compressed so that the spring element 50 may be appropriately positioned about the component 34. The projecting lip 54 of the cover member 52, is then slipped under the spring stop 46 and into the groove 42 of the main body member 40 of the tension device. Thereafter the motor driven pump 18 is turned on and pressure is applied to the cover member 52 to contract the springs within the footings 38 and bring the masking plate 20 and hence the undersurface of the substrate 32 surrounding the component 34 to be removed in contact with the molten solder being pumped through the orifice 14 of the fountain cap 12. When the molten solder causes the solder connections securing the component leads 56 to the substrate 32 to reflow the tension provided by the spring assembly 48 causes the component 34 to be removed from the board 32.

While the foregoing specifications has described one embodiment in accordance with the present invention, variations can be made without departing from the scope and spirit thereof. For example, it is not necessary that the heat for effectuating the reflow of the solder connections be provided by a solder pot. Any heating source could be used with equal effectiveness. Accordingly, a radiant or infrared heating source, to mention but a few alternatives, may be readily used.

What is claimed is:

1. Apparatus for effectuating the removal of a component from a substrate to which it has been soldered, comprising:

a concentrated source of heat constricted to an area which corresponds to the area encompassed by the solder connections securing said component to said substrate;

means for locating said substrate so that said component is positioned proximate to said source of heat; and a tension device adapted for attachment to said component, said tension device being poised to cause said component to be removed from said substrate when the solder connections are exposed to said source of heat.

2. Apparatus for effectuating the removal of a component from a substrate to which it has been solder secured, comprising:

a solder pot adapted to provide a solder wave;

a cover plate formed with an orifice. said orifice shaped to correspond to the area encompassed by the solder connections securing said component to said substrate, said cover plate adapted for disposal above said solder wave to constrict said wave to within said orifice; and a tension device adapted for attachment to said compenent, said tension device being poised to remove said component from said substrate when the solder connections are exposed to said constricted wave.

3. Apparatus for effectuating the removal of a component from a substrate to which it has been solder secured as defined in claim 2, wherein said cover plate is further formed with a plurality of holes, and further comprising locating means adapted to fit within said holes whereby said locating means can be appropriately fitted within selected holes to guide the positioning of said substrate such that the portion of said substrate to which said component as secured is disposed above the orifice within said cover plate and thereby exposed to said constricted solder wave.

4. Apparatus for effectuating the removal of a component from a substrate to which it has been solder secured as defined in claim 2 wherein said cover plate is spring mounted upon said solder pot such that upon the application of pressure to said cover plate it is brought in closer proximity to said solder pot.

References Cited

UNITED STATES PATENTS

| | | | |
|---|---|---|---|
| 3,045,336 | 7/1962 | Northrop et al. | 29—203H |
| 3,377,689 | 4/1968 | Kimmett | 29—206 |

THOMAS H. EAGER, Primary Examiner

U.S. Cl. X.R.

29—427